United States Patent [19]

Matsumoto et al.

[11] Patent Number: 5,009,721
[45] Date of Patent: Apr. 23, 1991

[54] SOLAR CELL

[75] Inventors: Hideo Matsumoto, Kobe; Shigeru Hokuyo, Itami, both of Japan

[73] Assignee: Mitsubishi Denki Kabushiki Kaisha, Japan

[21] Appl. No.: 388,381

[22] Filed: Aug. 2, 1989

[30] Foreign Application Priority Data

Aug. 26, 1988 [JP] Japan .................. 63-212905

[51] Int. Cl.$^5$ ............................................. H01L 31/05
[52] U.S. Cl. .................................. 136/256; 136/244; 357/30; 357/71
[58] Field of Search .............. 136/244, 256; 357/30 J, 357/30 Q, 71

[56] References Cited

U.S. PATENT DOCUMENTS 4,340,803  6/1982  Coyle .................. 219/56.22

FOREIGN PATENT DOCUMENTS 3627641   2/1988  Fed. Rep. of Germany ...... 136/256
55-134984 10/1980 Japan .................................. 136/256
61-53950   4/1986 Japan ........................................ 437/2
62-139362  6/1987 Japan ...................................... 136/244
1333593  10/1973 United Kingdom ................ 136/244

OTHER PUBLICATIONS

"10.4 Assembly Process", Solar Cell Design Handbook, JPL, pp. 10.4-1 to 10.4-6.
Schilling et al., "New Aspects . . . Interconnector", Proc. 5th European Symposium, Sep./Oct. 1986, pp. 49-53.
Koch, "Module Technique . . . Cells", Proc. 3rd European Symposium, Jun. 1982, pp. 17-21.

Primary Examiner—Aaron Weisstuch
Attorney, Agent, or Firm—Leydig, Voit & Mayer

[57] ABSTRACT

A solar cell device in which a plurality of solar cell elements are connected by interconnectors includes a metal film inserted between the electrode of the solar cell element and the interconnector, and the welded area between the metal film and the electrode is larger than the welded area between the metal film and the interconnector.

7 Claims, 4 Drawing Sheets

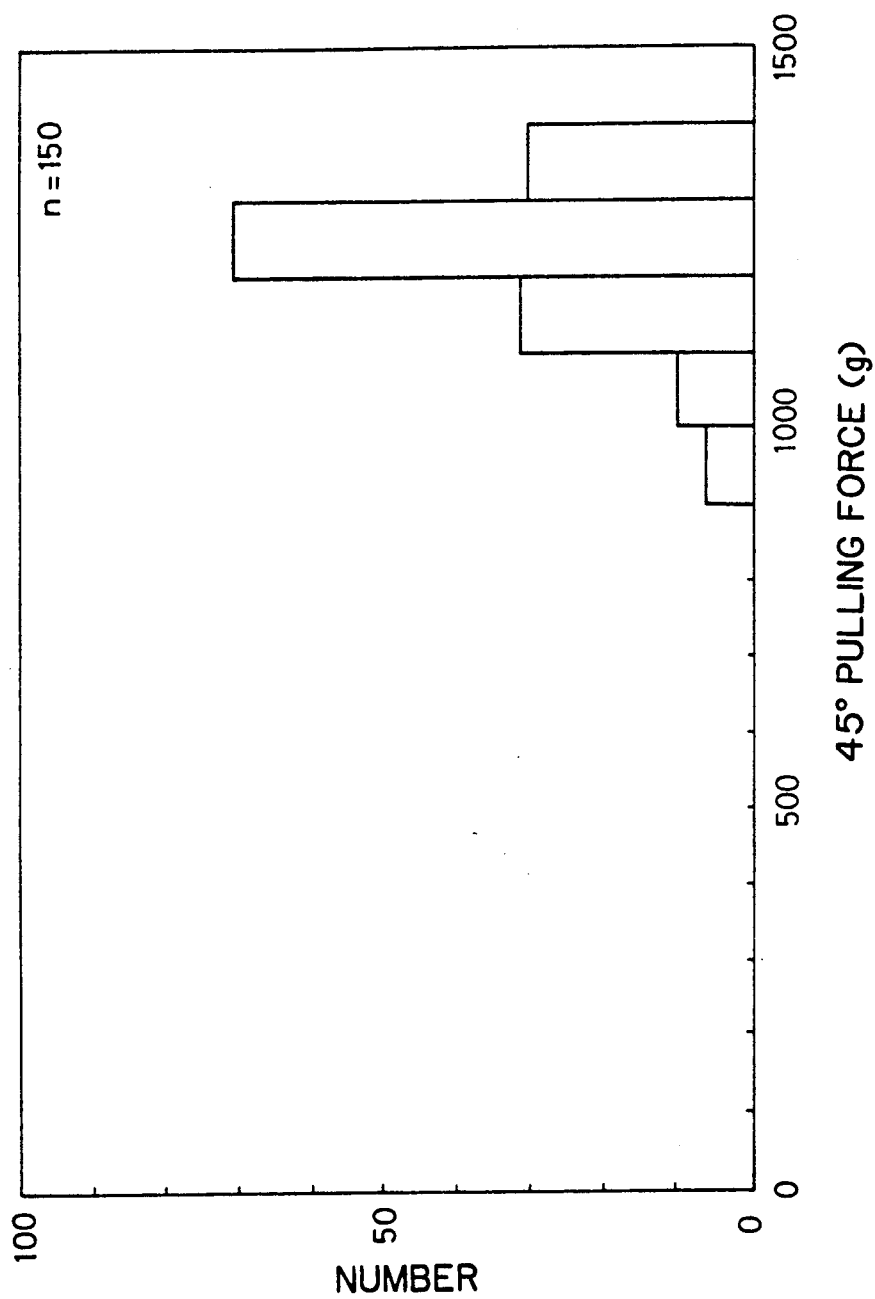

SOLAR CELL

FIELD OF THE INVENTION

The present invention relates to a solar cell device, and more particularly to a plurality of interconnected solar cell elements.

BACKGROUND OF THE INVENTION

FIG. 3 shows a cross section of a prior art solar cell by which a plurality of similar solar cell elements are able to be interconnected.

In FIG. 3, reference numeral 1 designates a solar cell device and reference numeral 2 designates a solar cell element. The solar cell element 2 has a light receiving surface 2a and a rear surface 2b. An electrode 3 is disposed on the light receiving surface 2a and an electrode 4 is disposed on the rear surface 2b. An interconnector 5 comprising Ag is disposed on the electrode 3. A p type GaAs layer 11 and an n type GaAs layer 12 constitute a pn junction. A p type AlGaAs contact layer 10 is disposed on the p type GaAs layer 11. A reflection preventing film 9 comprising, for example, $Si_3N_4$ is disposed on the p type GaAs layer.

Light incident on the light receiving surface 2a generates charge carriers in the p type AlGaAs layer 10, p type GaAs layer 11, and n type GaAs layer 12, thereby generating an electromotive force in the solar cell element 2. Thus generated electromotive force is outputted to the outside of the solar cell element 1 via the electrodes 3 and 4. In order to obtain a desired output, it is required to interconnect the electrodes 3 of respective solar cell elements 1 by using interconnectors 5.

Conventionally, the interconnector 5 is connected to the external connection electrode 3 by soft soldering. In a solar cell device in which a plurality of solar cell elements are mutually connected by interconnectors 5 and mounted on an artificial satellite, the wide range of change in the temperatures places stresses on the solder layer between the interconnector 5 and the electrode 3. The solder may be decomposed, causing variation in the resistance of the junction and reduction in its mechanical strength.

In order to avoid these problems, a the electrode 3 and the interconnector 5 are connected by direct welding. A method called parallel gap welding is generally used. The welding preferably does not influence the element characteristics such as reducing power output due to leakage at the junction and the mechanical strength of the junction portion should be higher than the element strength.

In the prior art solar cell thus constructed, 45 degree pull strength distribution of the welding portion which is obtained after the welding of interconnector 5 is shown in FIG. 5. The 45 degree pull strength means the magnitude of force applied to separate the interconnector 5 from the electrode 3 when the interconnector 5 is pulled up in the direction F shown in FIG. 4. The the interconnector 5 is pulled in a direction of 45 degrees from the junction of the interconnector 5 and the electrode 3.

As a result of this experiment, it has been found that the welding strength distribution for a large number of samples is as shown in FIG. 5. There, one sample has quite a low strength. The main cause of such variations in welding strength is thought to be concentration of force. That is, since the p type GaAs layer 11 and the p type AlGaAs layer 10 are grown by liquid phase epitaxy, the surface of the solar cell 2 is likely to have corrugations and the electrode surface of the element is not always flat. The interface of the weld between the electrode 3 and the interconnector 5 is not a straight line.

Accordingly, when a pulling force is applied to the weld, the force is thought to be mainly applied to the edge of the weld of the interconnector 5 and the electrode 3. Then, various kinds of distribution of applied force may be conceived. In an extreme case, the force may be concentrated on quite a small area. In such a case, even when the junction strength between element and electrode is uniform, the force is concentrated on a narrow area and the welding strength between the interconnector 5 and the electrode 3 shows a low value. Accordingly, for solving the above described problems, the following three methods are conceived:

(1) enhance the junction strength between the solar cell device 1 and the electrode 3

(2) make the surface of electrode 3 planar, and (3) enhance the strength of the electrode 3 itself.

However, all of these methods have problems, which result in difficulty in realization.

As the first method which attempts to enhance the junction strength between the element 1 and the external connection electrode 3, generally, mutual diffusion by sintering can be conceived. However, in solar cells the depth of the pn junction between p type GaAs layer 11 and n type GaAs layer 12 from the light receiving surface 2a is shallow. The shallow junction depth permits photocarriers to be collected even if the diffusion length of the photocarriers is reduced due to crystal defects generated by radiation. Therefore, when the temperature is raised by sintering, Ti or Pd from the electrode 3 may enter the light to electricity conversion section, causing leakage at the pn junction, and deterioration in the element characteristics.

The above-described second method which attempts to make the concave-convex of the surface of electrode 3 flat also has difficulty. That is, the p type AlGaAs layer 10 and the p type GaAs layer 11 below the electrode 3 are produced by liquid phase epitaxy, inevitably causing concave and convex features in the surface. This makes flattening the surface on which electrode 3 is subsequently disposed difficult.

In the above described third method which attempts to enhance the strength of the electrode itself, it is necessary to increase the thickness of electrode 3 using the same material for the electrode 3. The stress which is applied to the element is also increased with an increase in the electrode thickness, thereby causing unfavorable mechanical and electrical influences on the solar cell device.

SUMMARY OF THE INVENTION

An object of the present invention is to provide a solar cell device having a high and stable welding strength between the solar cell element and interconnectors.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, when connecting a plurality of solar cell elements together with interconnectors, a metal film is inserted between the electrodes of the solar cell element the interconnector, and the welded area between the metal film and the electrode is made larger than the welded area between the metal film and the interconnector. Accordingly, the force applied to the electrode of the element from the interconnector is spread out by the metal film, and the metal film functions as a buffer layer, thereby preventing concentrations of force onto a point of the element electrode, resulting in a stable welding strength.

BRIEF DESCRIPTION OF THE DRAWINGS

FIG. 2 is a diagram showing 45 degree pull strength distribution between the external connection electrode and the interconnector of the solar cell element of the embodiment of FIG. 1;

DETAILED DESCRIPTION OF THE PREFERRED EMBODIMENTS

An embodiment of the present invention will be described in detail with reference to the drawings.

Figure 1A:
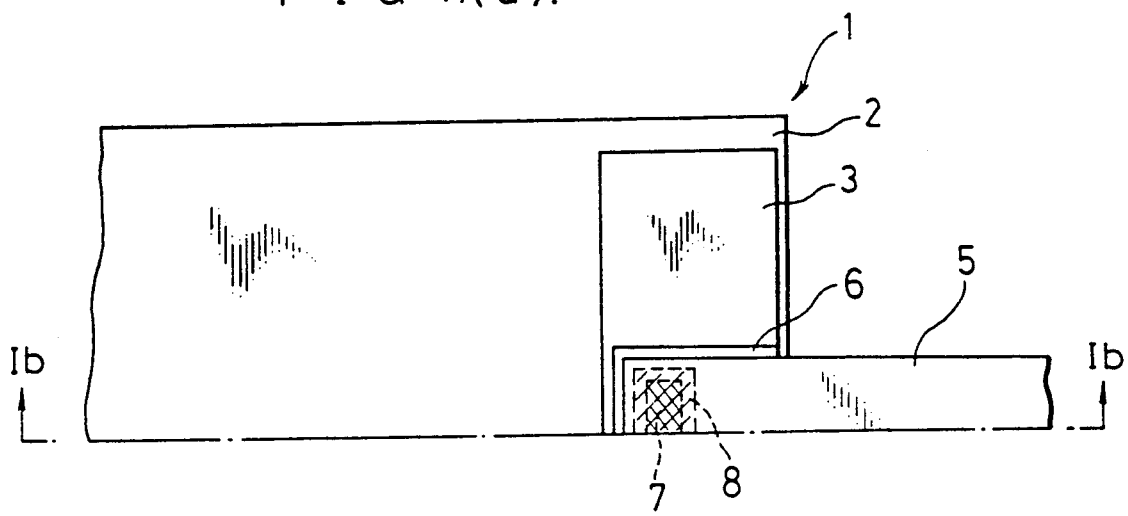
FIG. 1(a) is a plan view of a solar cell according to an embodiment of the present invention.
Figure 1B:
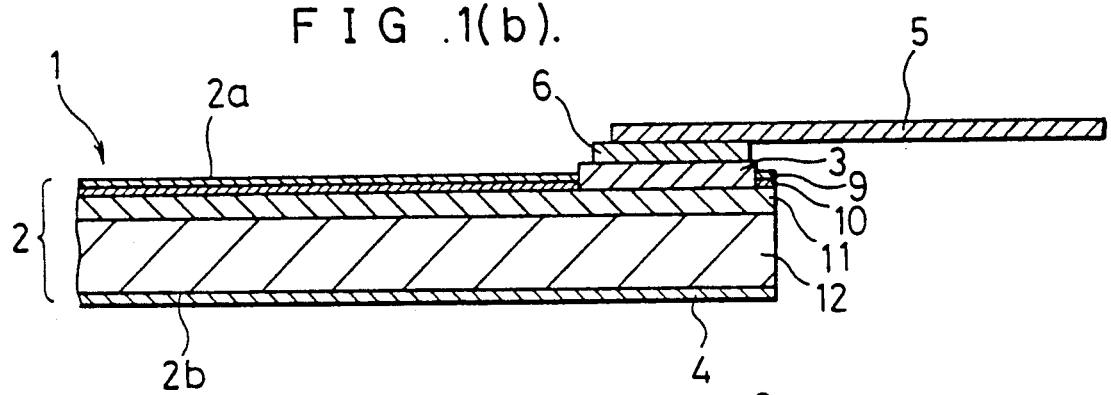
FIG. 1(b) is a cross sectional view of the solar cell of FIG. 1(a) taken along line Ib—Ib.
Figure 1C:
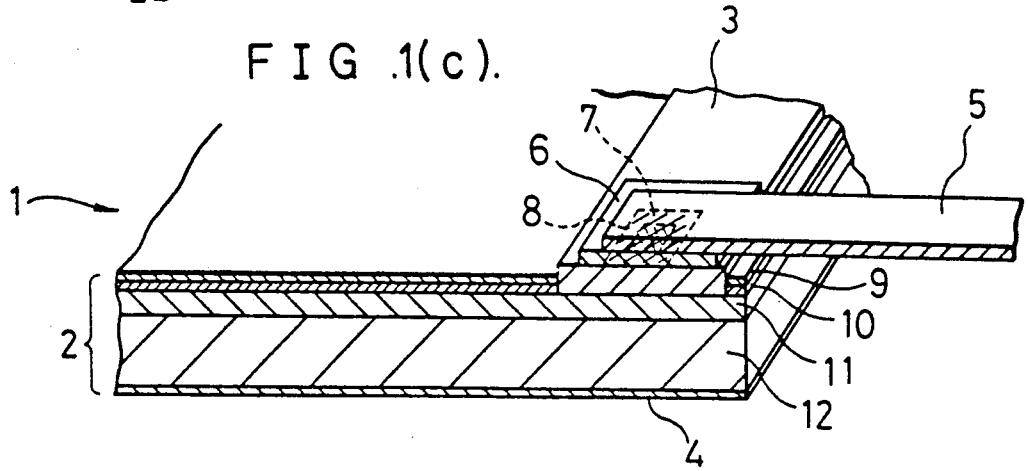
FIG. 1(c) is a perspective view of the solar cell of FIG. 1(a)
Figure 3:
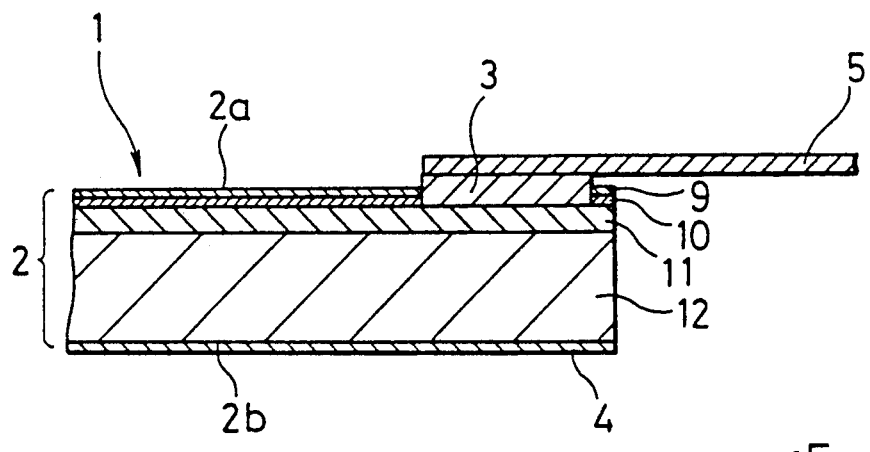
FIG. 3 is a cross sectional view showing a prior art solar cell.
Figure 4:
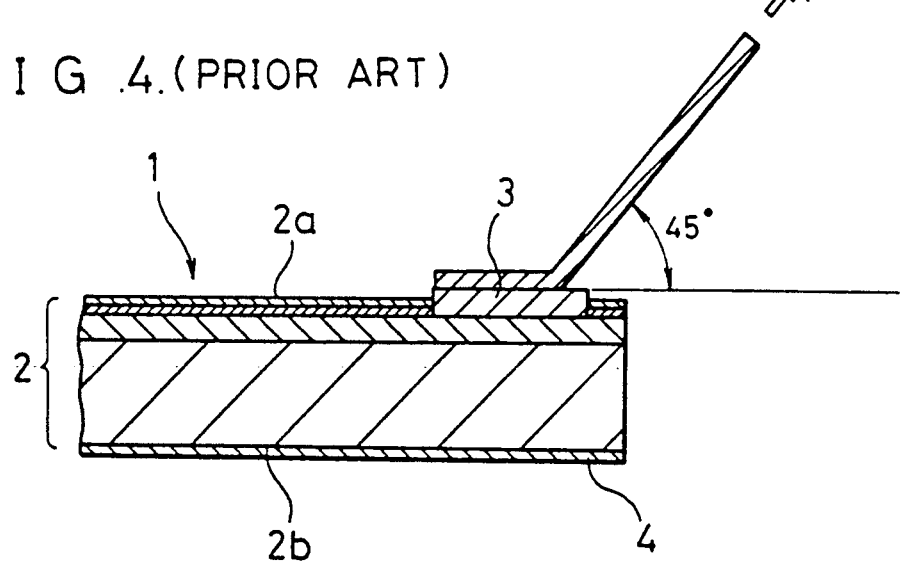
FIG. 4 is a diagram showing the 45 degree pull strength test of a solar cell.
Figure 5:
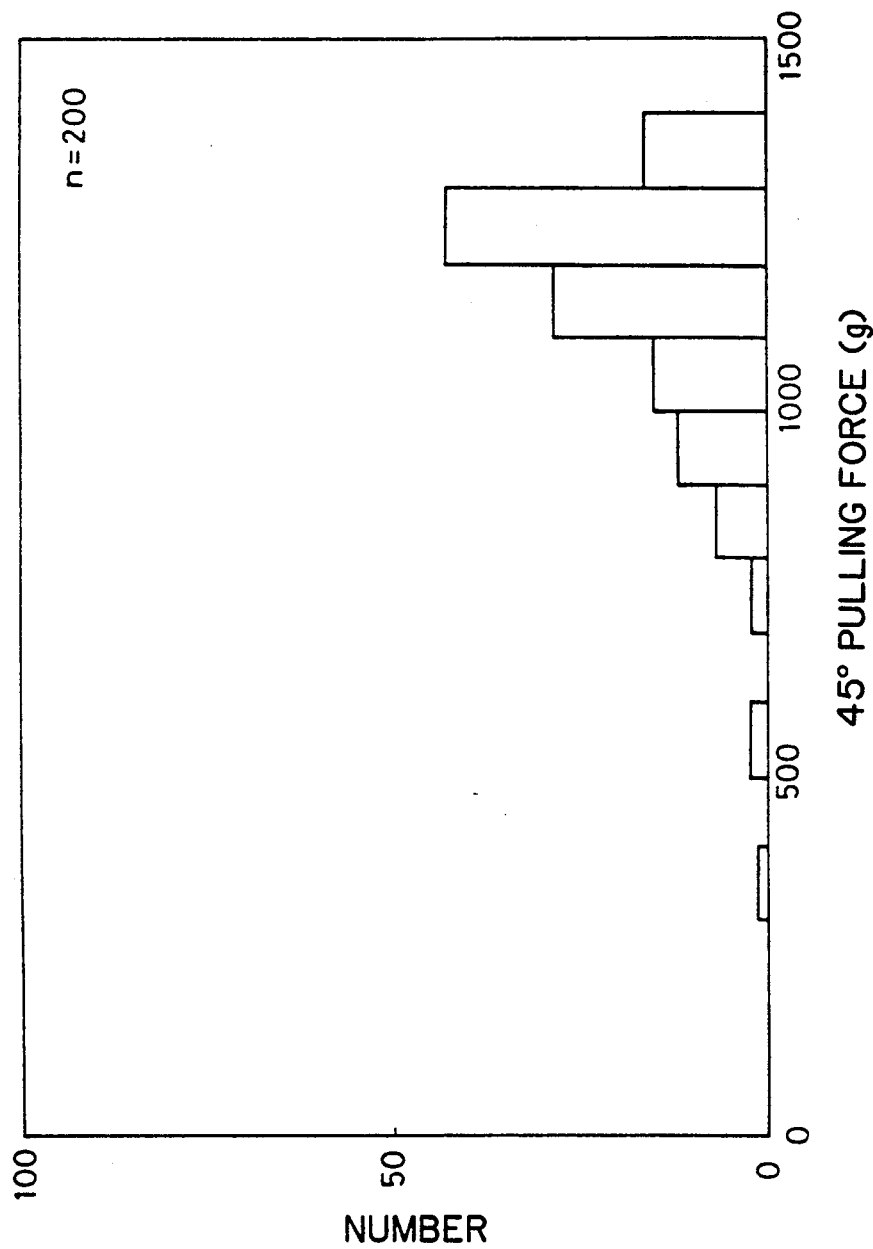
FIG. 5 is a diagram showing a 45 degree pull strength distribution between the external connection electrode and interconnector of the prior art solar cell.

FIG. 1(a) shows a plan view of a solar cell according to an embodiment of the present invention and FIGS. 1(b) and 1(c) show cross sectional view and perspective view thereof, respectively. In FIG. 1, the same reference numerals designate the same or corresponding elements as those shown in FIG. 3. An Ag film 6 is disposed between the external connection electrode 3 and the interconnector 5. Reference numeral 7 designates a welded portion between the interconnector 5 and Ag film 6 and reference numeral 8 designates a welded portion between the Ag film 6 and the electrode 3.

The production method of this embodiment will be described.

On an n type GaAs layer 12 about 180 microns thick to 300 microns thick, a p type GaAs layer 11 of about 0.5 micron and a p type AlGaAs layer 10 about 500 Angstroms thick are successively grown by liquid phase epitaxy. Subsequently, a reflection preventing film 9 comprising $Si_3N_4$ is disposed on the surface of p type AlGaAs layer 10 by CVD (Chemical Vapor Deposition) or sputtering. Thereafter contact holes are opened by etching the reflection preventing film 9 and p type AlGaAs layer 10. An electrode 3 comprising Ti(500 Å)/Pd(50 Å)/Ag(4 to 5 microns) is deposited at the contact holes by vapor deposition or sputtering, and an electrode 4 comprising Au-Ge/Ni/Au (the total thickness of the of three layers amounting to about 1 micron)/Ag(4 to 5 micron) is deposited at the rear surface 2b of the solar cell.

Next, the solar cell element 1 and the interconnector 5 are welded by a parallel gap welding method. In connecting a plurality of solar cells, firstly, an Ag film 6 having a thickness of at least 5 microns and preferably 10 to 50 microns is welded onto the electrode 3 of element 2. Thereafter an interconnector 5 is welded onto this Ag film 6. Herein, the welded portion 8 between the electrode 3 and Ag film 6 is larger than the welded portion 7 between the interconnector 5 and Ag film 6, and the ratio of those areas is about 3 to 1.

FIG. 2 shows the result of 45 degree pull strength experiment of the welded portion between the electrode 3 and the interconnector of a solar cell according to an embodiment of the present invention. The method of the experiment is the same as that described with respect to the experiment with the prior art devices. As seen from the figure, the strength distribution in the case where Ag film 6 is previously welded shows quite a high strength concentration, showing high stability. That is, as shown in FIG. 1, by welding the Ag film 6 and the electrode 3 at an area larger than the welded area between the interconnector 5 and Ag film 6, the force from the interconnector 5 can be spread out by the Ag film 6. Accordingly, the force which is applied to the welded portion of the electrode 3 of the element can be also spread out, thereby increasing the welding strength between the element and the interconnector 5, resulting in high stability.

While in the above illustrated embodiment an Ag film is employed for the metal film 6 which is to disposed between the electrode 3 and the interconnector 5, this metal film may comprise, for example, a Au film, with the same effects as described above.

As discussed above, according to the present invention, a metal film is inserted between the external connection electrode and the interconnector of the solar cell device and the welded area between the metal film and the electrode is made larger than the welded area between the metal film and the interconnector. Therefore, where there are problems in the junction strength and surface condition of the element electrode, a strong and stable welding strength between the solar cell element and interconnector is obtained, thereby providing a high reliability solar cell.

What is claimed is:

1. A solar cell for use in a device in which a plurality of solar cell elements are interconnected, comprising:
a solar cell element for converting light into electricity, including a photoresponsive junction in a semiconductor body and first and second electrodes disposed on said body, an interconnector for interconnecting said solar cell elements to another solar cell element, joined to said first electrode, and a metal film disposed between and welded to said first electrode and said interconnector, wherein the welded area between said metal film and said first electrode is about three times the welded area between said metal film and said interconnector.

2. A solar cell as defined in claim 1, wherein said metal film comprises Ag.

3. A solar cell as defined in claim 1, wherein said metal film comprises Au.

4. A solar cell as defined in claim 1, wherein the thickness of said metal film is at least 5 microns.

5. A solar cell as defined in claim 1, wherein said first electrode comprises Ti/Pd/Ag.

6. A solar cell as defined in claim 1, wherein said metal film and said first electrode and said first electrode and said interconnector are respectively welded together by a parallel gap welding method.

7. A solar cell as defined in claim 1 wherein the thickness of the metal film is 10 to 50 microns.

* * * * *